US012804897B2

(12) United States Patent
Jiang

(10) Patent No.: US 12,804,897 B2
(45) Date of Patent: Nov. 17, 2026

(54) PROGRAMMABLE DEVICE, PROGRAMMABLE DEVICE ARRAY, OPERATION METHODS THEREFOR, AND MEMORY

(71) Applicant: CXMT CORPORATION, Hefei (CN)

(72) Inventor: Huande Jiang, Hefei (CN)

(73) Assignee: CXMT Corporation, Hefei (CN)

( * ) Notice: Subject to any disclaimer, the term of this patent is extended or adjusted under 35 U.S.C. 154(b) by 154 days.

(21) Appl. No.: 18/948,559

(22) Filed: Nov. 15, 2024

(65) Prior Publication Data

US 2025/0107076 A1 Mar. 27, 2025

Related U.S. Application Data

(63) Continuation of application No. PCT/CN2024/105196, filed on Jul. 12, 2024.

(30) Foreign Application Priority Data

Sep. 21, 2023 (CN) ........................ 202311229610.4

(51) Int. Cl.
*H10B 20/25* (2023.01)
*G11C 17/16* (2006.01)
*G11C 17/18* (2006.01)

(52) U.S. Cl.
CPC ............. *H10B 20/25* (2023.02); *G11C 17/16* (2013.01); *G11C 17/18* (2013.01)

(58) Field of Classification Search
CPC .......... H10B 20/25; G11C 17/16; G11C 17/18
USPC ............................................................ 365/96
See application file for complete search history.

(56) References Cited

U.S. PATENT DOCUMENTS

2008/0042235 A1 2/2008 Kodama
2012/0248546 A1 10/2012 Tong et al.
2013/0077381 A1 3/2013 Kwon
2014/0183689 A1 7/2014 Sung
(Continued)

FOREIGN PATENT DOCUMENTS

CN 113496989 A 10/2021

OTHER PUBLICATIONS

ISA State Intellectual Property Office of the People's Republic of China, International Search Report Issued in Application No. PCT/CN2024/105196, Jul. 12, 2024, WIPO, 3 pages.

*Primary Examiner* — Amir Zarabian
*Assistant Examiner* — Daniel John King
(74) *Attorney, Agent, or Firm* — SYNCODA LLC; Feng Ma

(57) ABSTRACT

Provided are a programmable device, a programmable device array, operation methods therefor, and a memory. The programmable device includes: a bit line; a select transistor, a first source/drain of the select transistor being electrically connected to the bit line; a select signal line, the select signal line being electrically connected to a gate of the select transistor; a plurality of diodes; a plurality of anti-fuse cells, a first end of each one of the plurality of anti-fuse cells being electrically connected to a second source/drain of the select transistor via a corresponding one of the plurality of diodes; and a plurality of word lines, each one of the plurality of word line being electrically connected to a second end of a corresponding one of the plurality of anti-fuse cells.

13 Claims, 4 Drawing Sheets

200

(56) References Cited

U.S. PATENT DOCUMENTS

| | | | | |
|---|---|---|---|---|
| 2016/0141049 | A1* | 5/2016 | Song | G11C 17/16<br>365/51 |
| 2021/0202504 | A1* | 7/2021 | Chang | G11C 17/16 |
| 2021/0350863 | A1* | 11/2021 | Liu | G11C 17/16 |
| 2023/0061128 | A1* | 3/2023 | Yang | H10B 41/27 |
| 2025/0107076 | A1* | 3/2025 | Jiang | G11C 17/16 |

* cited by examiner

PROGRAMMABLE DEVICE, PROGRAMMABLE DEVICE ARRAY, OPERATION METHODS THEREFOR, AND MEMORY

CROSS-REFERENCE TO RELATED APPLICATIONS

This application is a continuation application of International Patent Application No. PCT/CN2024/105196, filed on Jul. 12, 2024, which is based on and claims priority to Chinese Patent Application No. 202311229610.4 filed on Sep. 21, 2023 and entitled "PROGRAMMABLE DEVICE, PROGRAMMABLE DEVICE ARRAY, OPERATION METHODS THEREFOR, AND MEMORY", which is incorporated herein by reference in its entirety.

TECHNICAL FIELD

The present disclosure relates to the field of semiconductor technologies and relates to but is not limited to a programmable device, a programmable device array, operation methods therefor, and a memory.

BACKGROUND

A dynamic random access memory (DRAM) chip generally is provided with redundant memory cells. When a memory cell on the DRAM chip becomes defective, a redundant memory cell may replace the defective memory cell to repair the DRAM. When the DRAM chip is being repaired, a one time programmable (OTP) device, such as an anti-fuse cell, is used. At present, a programmable device includes a select transistor and a programming transistor, taking up a relatively large area.

In addition, with the rapid development of integrated circuit technologies, the size of a chip is increasingly smaller, and thus the distance between programmable devices is shorter. Consequently, in one aspect, a programming transistor and an adjacent transistor are subjected to false breakdown, affecting the effect of anti-fuse cell repair; in another aspect, there is tight coupling between a programmable transistor and a select transistor, affecting the performance of the programmable device.

SUMMARY

In view of this, embodiments of the present disclosure provide a programmable device, a programmable device array, operation methods therefor, and a memory.

In a first aspect, an embodiment of the present disclosure provides a programmable device, which includes: a bit line; a select transistor, a first source/drain of the select transistor being electrically connected to the bit line; a select signal line, the select signal line being electrically connected to a gate of the select transistor; a plurality of diodes; a plurality of anti-fuse cells, a first end of each one of the plurality of anti-fuse cells being electrically connected to a second source/drain of the select transistor via a corresponding one of the plurality of diodes; and a plurality of word lines, each one of the plurality of word lines being electrically connected to a second end of a corresponding one of the plurality of anti-fuse cells.

In some embodiments, the plurality of diodes are disposed in a substrate and each one of the plurality of diodes includes a first region disposed adjacent to one of the plurality of anti-fuse cells and a second region disposed adjacent to the first region;

the second region of one of the plurality of diodes corresponding to one of the plurality of anti-fuse cells disposed adjacent to the select transistor occupies a same position as the second source/drain.

In some embodiments, the programmable device further includes a metal layer;

the second region of the diode corresponding to the anti-fuse cell that is not adjacent to the select transistor is connected to the second source/drain via the metal layer.

In some embodiments, the programmable device further includes a plurality of first conductive pillars; each one of the plurality of first conductive pillars being connected to the second region of the diode corresponding to the anti-fuse cell that is not adjacent to the select transistor, and the plurality of first conductive pillars being collectively connected to the metal layer.

In some embodiments, the select transistor and the plurality of anti-fuse cells are disposed in a same active region and spaced apart in sequence along a first direction; the programmable device further includes: a second conductive pillar connected between the first source/drain and the bit line; a first connection structure connected between the gate of the select transistor and the select signal line; and second connection structures, each one of the second connection structures being connected between the second end of one of the plurality of anti-fuse cells and one of the plurality of word lines.

In some embodiments, the select transistor includes a first gate dielectric layer and a first gate conductive layer on a surface of the first gate dielectric layer; the anti-fuse cell includes a second gate dielectric layer and a second gate conductive layer on a surface of the second gate dielectric layer, where a thickness of the second gate dielectric layer is less than a thickness of the first gate dielectric layer.

In some embodiments, the first region and the active region are N-type doped, and the second region and the first source/drain are P-type doped.

In a second aspect, an embodiment of the present disclosure provides a programmable device array, which includes: a plurality of programmable devices according to the first aspect arranged in sequence along a second direction, where the gates of the select transistors arranged in a row along the second direction are connected to each other, and the second ends of the anti-fuse cells arranged in a row along the second direction are connected to each other.

In some embodiments, the gates of the select transistors arranged in a row along the second direction are connected to a same select signal line;

the second ends of the anti-fuse cells arranged in a row along the second direction are connected to a same word line.

In a third aspect, an embodiment of the present disclosure provides an operation method for a programmable device, which is applied to the programmable device according to the first aspect; the method includes: during a programming operation, setting the bit line corresponding to an anti-fuse cell required to be programmed to a first voltage, applying a second voltage to the select signal line, and applying a third voltage to a word line corresponding to the anti-fuse cell required to be programmed, thus breaking down the anti-fuse cell required to be programmed, and meanwhile, applying the first voltage to other word lines in the programmable device to avoid breakdown of other anti-fuse cells except for the anti-fuse cell required to be programmed, where the anti-fuse cell required to be programmed is any one of the plurality of anti-fuse cells; and during a reading operation, setting the bit line corresponding to an anti-fuse cell required to be read to a first voltage, applying a second voltage to the select signal line, and applying a fourth voltage to a word line corresponding to the anti-fuse cell required to be read, thus reading data in the anti-fuse cell required to be read, and meanwhile, applying the first voltage to other word lines in the programmable device, where the third voltage is greater than the second voltage, and the second voltage is greater than the first voltage; the first voltage is a zero voltage or a grounding voltage; a difference between the third voltage and the first voltage is greater than or equal to a breakdown voltage of the anti-fuse cell required to be programmed; a difference between the second voltage and the first voltage is greater than or equal to a turn-on voltage of the select transistor.

In a fourth aspect, an embodiment of the present disclosure provides an operation method for a programmable device array, which is applied to the programmable device array according to the second aspect; the method includes: during a programming operation, setting a bit line corresponding to an anti-fuse cell required to be programmed to a first voltage, applying a second voltage to a select signal line, and applying a third voltage to a word line corresponding to the anti-fuse cell required to be programmed, thus breaking down the anti-fuse cell required to be programmed, and meanwhile, applying the first voltage to other word lines in the programmable device array and applying a fifth voltage to other bit lines in the programmable device array to avoid breakdown of other anti-fuse cells except for the anti-fuse cell required to be programmed, where the anti-fuse cell required to be programmed is any one of a plurality of anti-fuse cells; and during a reading operation, setting a bit line corresponding to an anti-fuse cell required to be read to a first voltage, applying a second voltage to a select signal line, and applying a fourth voltage to a word line corresponding to the anti-fuse cell required to be read, thus reading data in the anti-fuse cell required to be read, and meanwhile, applying the first voltage to other word lines in the programmable device array, and applying the fourth voltage to other bit lines in the programmable device array, where the third voltage is greater than the second voltage, and the second voltage is greater than the first voltage; the first voltage is a zero voltage or a grounding voltage; a difference between the third voltage and the first voltage is greater than or equal to a breakdown voltage of the anti-fuse cell required to be programmed; a difference between the third voltage and the fifth voltage is less than a breakdown voltage of any one anti-fuse cell in the programmable device array; a difference between the second voltage and the first voltage is greater than or equal to a turn-on voltage of the select transistor.

In a fifth aspect, an embodiment of the present disclosure provides a memory, which includes the programmable device array according to the second aspect.

Embodiments of the present disclosure provide a programmable device, a programmable device array, operation methods therefor, and a memory. The programmable device includes: a bit line; a select transistor, a first source/drain of the select transistor being electrically connected to the bit line; a select signal line, the select signal line being electrically connected to a gate of the select transistor; a plurality of diodes; a plurality of anti-fuse cells, a first end of each one of the plurality of anti-fuse cells being electrically connected to a second source/drain of the select transistor via a corresponding one of the plurality of diodes; and a plurality of word lines, each one of the word line being electrically connected to a second end of a corresponding one of the plurality of anti-fuse cells. As the programmable device in the embodiments of the present disclosure includes one select transistor and a plurality of anti-fuse cells, an area of the programmable device can be reduced, and the coupling effect between the select transistor and the anti-fuse cells can be reduced, thereby improving the performance of the programmable device. In addition, as the programmable device in the embodiments of the present disclosure includes a plurality of diodes corresponding to the plurality of anti-fuse cells, and the anti-fuse cells are connected to the select transistor via the diodes, that is, no doped region (e.g., a lightly doped region) is provided below the anti-fuse cells, false breakdown between adjacent anti-fuse cells can be prevented.

BRIEF DESCRIPTION OF THE DRAWINGS

In the drawings (may not necessarily be drawn to scale), similar reference numerals may describe similar components in different views. Similar reference numerals with different suffix letters may represent similar components in different examples. The drawings show generally, by way of example without limitation, various embodiments discussed herein.

DETAILED DESCRIPTION

Figure 1:
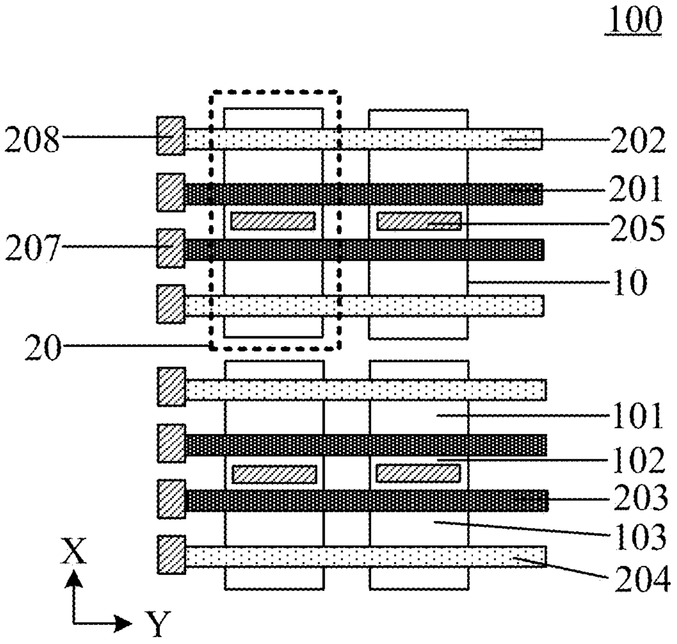
FIG. 1 is a structural schematic diagram of a programmable device.

Exemplary embodiments of the present disclosure will be described in more detail below with reference to the drawings. While exemplary embodiments of the present disclosure are shown in the drawings, it should be understood that the present disclosure may be implemented in various forms and should not be limited by the specific embodiments set forth herein. Rather, these embodiments are provided so that the present disclosure will be more thoroughly understood and the scope of the present disclosure will be fully conveyed to those skilled in the art.

In the following descriptions, many details are provided for a more thorough understanding of the present disclosure. However, it is apparent to those skilled in the art that the present disclosure can be implemented without one or more of these details. In other examples, to avoid confusion with the present disclosure, some technical features commonly known in the art are not described. That is, not all features of the practical embodiments are described herein, and well-known functions and structures are not described in detail.

In the drawings, the sizes of layers, regions, and elements and relative sizes thereof may be exaggerated for clarity. Identical reference numerals refer to identical elements throughout this specification.

It should be understood that when an element or layer is referred to as being "on", "adjacent to", "connected to", or "coupled to" another element or layer, the element or layer may be directly on, adjacent to, connected to, or coupled to the another element or layer, or there may be an element or layer in between. On the contrary, when an element is referred to as being "directly on", "directly adjacent to", "directly connected to", or "directly coupled to" another element or layer, there is no element or layer in between. It should be understood that, although the terms first, second, third, etc., may be used to describe various elements, components, regions, layers, and/or portions, the elements, components, regions, layers, and/or portions should not be limited by these terms. These terms are merely used to distinguish one element, component, region, layer, or portion from another element, component, region, layer, or portion. Thus, a first element, component, region, layer, or portion discussed below may be denoted as a second element, component, region, layer, or portion without departing from the instructions of the present disclosure. The discussion of a second element, component, region, layer, or portion does not necessarily imply that a first element, component, region, layer, or portion necessarily exists in the present disclosure.

The terms used herein are merely for describing specific embodiments and should not be construed as limiting the present disclosure. When used herein, the singular forms "a", "an", and "the" are intended to include the plural forms as well, unless the context clearly indicates otherwise. It should be further understood that the terms "comprise" and/or "include", when used in this specification, specify the presence of stated features, integers, steps, operations, elements, and/or components, but do not exclude the presence or addition of one or more other features, integers, steps, operations, elements, components, and/or groups. When used herein, the term "and/or" includes any and all combinations of related listed items.

FIG. 1 is a structural schematic diagram of a programmable device. As shown in FIG. 1, a programmable device 100 includes a plurality of anti-fuse structures 20 arranged in an array along a first direction (for example, an X-axis direction shown in FIG. 1) and a second direction (for example, a Y-axis direction shown in FIG. 1). For example, four anti-fuse structures 20 are shown in FIG. 1. The anti-fuse structure 20 includes a first anti-fuse cell and a second anti-fuse cell. The first anti-fuse cell and the second anti-fuse cell are formed on an active region 10, and the active region 10 includes at least a first doped region 101, a second doped region 102, and a third doped region 103. The first anti-fuse cell includes a first select transistor and a first programming device. The first select transistor includes a first gate 201, the first doped region 101, and the second doped region 102. The first programming device includes a second gate 202 and the active region 10 below. The second anti-fuse cell includes a second select transistor and a second programming device. The second select transistor includes a third gate 203, the second doped region 102, and the third doped region 103. The second programming device includes a fourth gate 204 and the active region 10 below. The first select transistor and the second select transistor share the second doped region 102. A bit line is electrically connected to the second doped region 102 via a connection structure 205. A plurality of first conductive lines 207 are connected to the first gate 201 or the third gate 203 for applying a turn-on voltage (for example, 1.1 V) to the first gate 201 or the third gate 203 during programming, thus turning on the first select transistor or the second select transistor. A plurality of second conductive lines 208 are connected to the second gate 202 or the fourth gate 204 for applying a high voltage (for example, about 4 V to 5.5 V) to the second gate 202 or the fourth gate 204, thus breaking down the first programming device or the second programming device during programming.

In the embodiment mentioned above, each anti-fuse cell in the programmable device 100 includes a select transistor and a programming transistor, taking up a relatively large area. In addition, with the rapid development of integrated circuit technologies, the size of a chip is increasingly smaller, and thus the distance between programmable devices is shorter. Consequently, in one aspect, a programming transistor and an adjacent transistor are subjected to false breakdown, affecting the effect of anti-fuse cell repair; in another aspect, there is tight coupling between a programmable transistor and a select transistor, affecting the performance of the programmable device.

In view of this, embodiments of the present disclosure provide a programmable device, a programmable device array, operation methods therefor, and a memory. The programmable device includes: a bit line; a select transistor, a first source/drain of the select transistor being electrically connected to the bit line; a select signal line, the select signal line being electrically connected to a gate of the select transistor; a plurality of diodes; a plurality of anti-fuse cells, a first end of each one of the anti-fuse cells being electrically connected to a second source/drain of the select transistor via a corresponding one of the plurality of diodes; and a plurality of word lines, each one of the word lines being electrically connected to a second end of a corresponding one of the plurality of anti-fuse cells. As the programmable device in the embodiments of the present disclosure includes one select transistor and a plurality of anti-fuse cells, an area of the programmable device can be reduced, and the coupling effect between the select transistor and the anti-fuse cells can be reduced, thereby improving the performance of the programmable device. In addition, as the programmable device in the embodiments of the present disclosure includes a plurality of diodes corresponding to the plurality of anti-fuse cells, and the anti-fuse cells are connected to the select transistor via the diodes, that is, no doped region is provided below the anti-fuse cells, false breakdown between adjacent anti-fuse cells can be prevented.

The embodiments of the present disclosure are described in detail below with reference to the drawings.

Before describing the embodiments of the present disclosure, three directions for describing a three-dimensional structure that may be used in the following embodiments are defined. Taking the Cartesian coordinate system as an example, the three directions may include X-axis, Y-axis, and Z-axis directions. A base substrate may include a top surface at a front side and a bottom surface at a back side opposite the front side. A direction intersecting (for example, perpendicular to) the top surface and bottom surface of the base substrate is defined as a third direction, without considering the flatness of the top surface and bottom surface. In a direction of the top surface and the bottom surface of the base substrate (namely, a plane where the base substrate is located), two intersecting directions (for example, perpendicular to each other) are defined. For example, a direction in which the select transistor and the anti-fuse cells are arranged may be defined as a first direction, and a direction of the plane of the base substrate can be determined based on the first direction and a second direction. In the embodiments of the present disclosure, the first direction, the second direction, and the third direction may be perpendicular to one another. In other embodiments, the first direction, the second direction, and the third direction may not be perpendicular to one another. In the embodiments of the present disclosure, the first direction is defined as the X-axis direction, the second direction is defined as the Y-axis direction, and the third direction is defined as the Z-axis direction.

Figure 2:
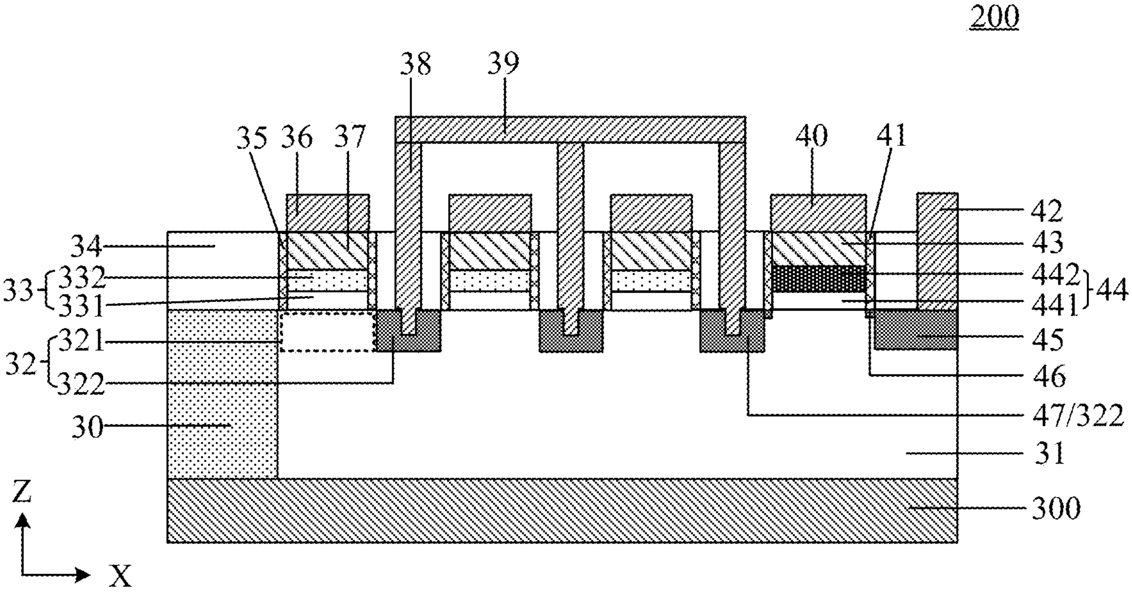
FIG. 2 is a first structural schematic diagram of a programmable device provided according to an embodiment of the present disclosure.
Figure 3:
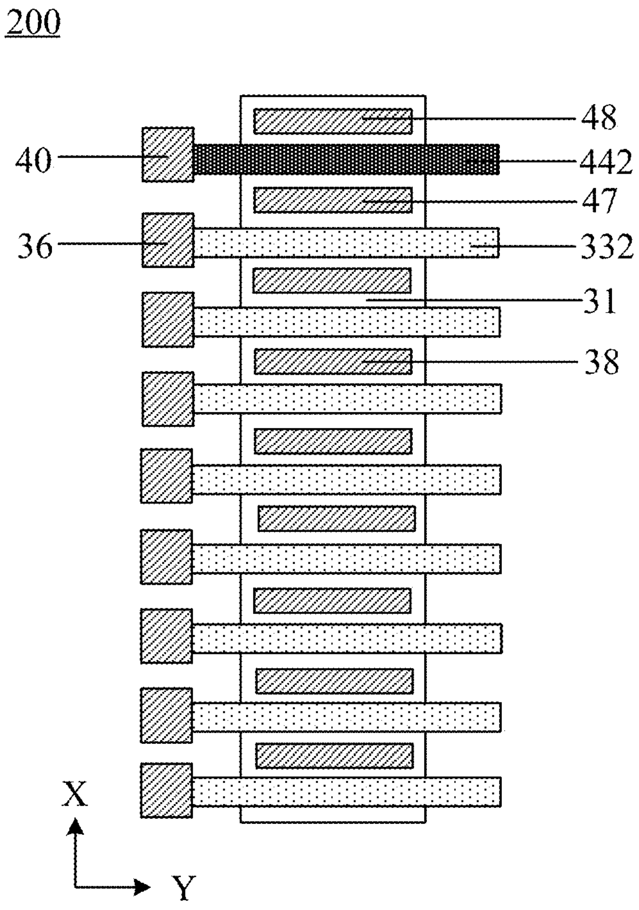
FIG. 3 is a second structural schematic diagram of a programmable device provided according to an embodiment of the present disclosure.

In an embodiment of the present disclosure, FIG. 2 and FIG. 3 are structural schematic diagrams of a programmable device provided according to an embodiment of the present disclosure. As shown in FIG. 2 and FIG. 3, the programmable device 200 includes:

a bit line 48 (shown in FIG. 3);

a select transistor, a first source/drain 45 of the select transistor being electrically connected to the bit line 48;

a select signal line 40, the select signal line 40 being electrically connected to a gate 44 of the select transistor;

a plurality of diodes 32;

a plurality of anti-fuse cells, a first end of each one of the anti-fuse cells being electrically connected to a second source/drain 47 of the select transistor via a corresponding one of the plurality of diodes 32; and a plurality of word lines 36, each one of the word line 36 being electrically connected to a second end of a corresponding one of the plurality of anti-fuse cells.

It should be noted that the programmable device 200 in the embodiments of the present disclosure is formed in a substrate 300, and the substrate 300 may be, for example, a semiconductor substrate. The semiconductor substrate may be a silicon substrate, and the semiconductor substrate may further include other semiconductor elements such as germanium (Ge); or include semiconductor compounds such as silicon carbide (SiC), gallium arsenide (GaAs), gallium phosphide (GaP), indium phosphide (InP), indium arsenide (InAs), or indium antimonide (InSb); or include other semiconductor alloys such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or a combination thereof.

In some embodiments, a plurality of active regions 31 are formed in the substrate 300, and the plurality of active regions 31 are isolated from each other by using a shallow trench isolation (STI) structure 30. The active region 31 may be an ion-doped region, and for example, may be an N-type doped region or a P-type doped region.

In the embodiment of the present disclosure, the select transistor is disposed on the active region 31, and the select transistor includes a gate 44, a first source/drain 45, and a second source/drain 47. The first source/drain 45 and the second source/drain 47 are formed by an ion-doped region in the active region 31.

In the embodiment of the present disclosure, the select transistor may be a PMOS transistor. In other embodiments, the select transistor may be an NMOS transistor.

In some embodiments, with further reference to FIG. 2, the select transistor includes a first gate dielectric layer 441 and a first gate conductive layer 442 on a surface of the first gate dielectric layer 441. A material of the first gate dielectric layer 441 may be silicon oxide or another suitable material. A material of the first gate conductive layer 442 may be any one material with good conductivity, for example, any one of or a combination of two or more of titanium (Ti), titanium nitride (TiN), tungsten nitride (WN), tungsten (W), cobalt (Co), platinum (Pt), palladium (Pd), ruthenium (Ru), copper (Cu), and polysilicon.

In some embodiments, with further reference to FIG. 2, diodes 32 are disposed in the substrate 300 and specifically in the active region 31 of the substrate 300. The diode 32 includes a first region 321 disposed adjacent to the anti-fuse cell and a second region 322 disposed adjacent to the first region 321.

It should be noted that the first region 321 is located in the active region 31 below the anti-fuse cell. That is, the first region 321 is a part of the active region 31, and therefore, a doping type of the first region 321 is the same as a doping type of the active region 31. In the embodiment of the present disclosure, the first region 321 and the active region 31 are N-type doped, and the second region 322 and the first source/drain 45 are P-type doped. In this case, the first source/drain 45 is also P-type doped, and the select transistor is a PMOS transistor.

In other embodiments, the first region 321 and the active region 31 may also be both P-type doped. When the first region 321 is P-type doped, the second region 322 is N-type doped, and the second source/drain 47 and the first source/drain 45 are also N-type doped. In this case, the select transistor is an NMOS transistor.

In some embodiments, with further reference to FIG. 2, the anti-fuse cell includes a second gate dielectric layer 331 and a second gate conductive layer 332 on a surface of the second gate dielectric layer 331. A material of the second gate dielectric layer 331 may be silicon oxide or another suitable material. A material of the second gate conductive layer 332 may be any one material with good conductivity, for example, any one of or a combination of two or more of titanium, titanium nitride, tungsten nitride, tungsten, cobalt, platinum, palladium, ruthenium, copper, and polysilicon.

It should be noted that the first end of the anti-fuse cell is an end that is connected to the second gate dielectric layer 331, and the second end of the anti-fuse cell is an end that is connected to the second gate conductive layer 332.

In some embodiments, a thickness of the second gate dielectric layer 331 is less than a thickness of the first gate dielectric layer 441. As the second gate dielectric layer 331 needs to be broken down at a high voltage during a programming operation, allowing the thickness of the second gate dielectric layer 331 to be less than that of the first gate dielectric layer 441 can not only reduce the energy for breaking down the anti-fuse cell, but also can prevent the select transistor corresponding to the anti-fuse cell from being broken down and thereby prevent the failure of the select transistor resulting therefrom.

In the embodiment of the present disclosure, the first end of the anti-fuse cell is electrically connected to the second source/drain 47 of the select transistor via a corresponding diode 32. When the first end of the anti-fuse cell is at a high voltage, the diode is cut off, and when the second source/drain 47 is at a high voltage, the diode is conductive. That is, a current can flow to the second end of the anti-fuse cell from the second source/drain 47, but cannot flow to the second source/drain 47 from the second end of the anti-fuse cell.

In the embodiment of the present disclosure, the anti-fuse cell is connected to the second source/drain 47 of the select transistor via the diode 32. That is, no lightly doped region is provided below the anti-fuse cell, so that after the second gate dielectric layer 331 of the anti-fuse cell is broken down, a high transient current resulting from the breakdown enters the first region 321 below. In addition, as the current does not flow to the second source/drain from the second end of the anti-fuse cell, the high transient current cannot flow into the second regions 322. That is, after the second gate dielectric layer 331 of the anti-fuse cell is broken down, the diode 32 is cut off, so that false breakdown between adjacent anti-fuse cells can be prevented.

In the embodiment of the present disclosure, with further reference to FIG. 2 and FIG. 3, the select transistor and the plurality of anti-fuse cells are disposed in the same active region 31. The select transistor and the anti-fuse cells are spaced apart in sequence along the X-axis direction, and the plurality of anti-fuse cells are also spaced apart in sequence along the X-axis direction.

As the programmable device in the embodiments of the present disclosure includes one select transistor and a plurality of anti-fuse cells, an area of the programmable device can be reduced, and the coupling effect between the select transistor and the anti-fuse cells can be reduced, thereby improving the performance of the programmable device.

It should be noted that the second region 322 of one of the plurality of diodes 32 corresponding to one of the plurality of anti-fuse cells disposed adjacent to the select transistor occupies a same position as the second source/drain 47. In this way, an area of the anti-fuse structure can be further reduced, and miniaturization can be achieved.

In some embodiments, with further reference to FIG. 2 and FIG. 3, the bit line 48 is connected to the first source/drain of the select transistor, and the word line 36 is connected to the second end of the anti-fuse cell (i.e., the second gate conductive layer 332). The word line 36 is configured to apply a high voltage to the second end of the anti-fuse cell during a programming operation, and the bit line 48 provides a low voltage for the first end of the anti-fuse cell during the programming operation, so that the anti-fuse cell is broken down when a voltage difference between the first end and the second end of the anti-fuse cell is greater than a breakdown voltage of the anti-fuse cell.

In some embodiments, with further reference to FIG. 2 and FIG. 3, the select signal line 40 is connected to the gate of the select transistor, specifically, to the first gate conductive layer 442 of the select transistor. The select signal line 40 is configured to apply a voltage to the first gate conductive layer 442 of the select transistor to turn on the select transistor during a programming operation or a reading operation.

In the embodiment of the present disclosure, materials of the bit line 48, the word line 36, and the select signal line 40 are any one material with good conductivity, for example, any one of or a combination of two or more of titanium, titanium nitride, tungsten nitride, tungsten, cobalt, platinum, palladium, ruthenium, and copper.

In some embodiments, with further reference to FIG. 2, the programmable device 200 further includes a metal layer 39. The second region 322 of the diode 32 corresponding to the anti-fuse cell that is not adjacent to the select transistor is connected to the second source/drain 47 via the metal layer 39.

In some embodiments, with further reference to FIGS. 2 and 3, the programmable device 200 further includes a plurality of first conductive pillars 38. Each one of the plurality of first conductive pillars 38 is connected to the second region 322 of the diode 32 corresponding to the anti-fuse cell that is not adjacent to the select transistor, and the plurality of first conductive pillars 38 are collectively connected to the metal layer 39.

In the embodiment of the present disclosure, the metal layer 39 can allow the second end of the anti-fuse cell that is not adjacent to the select transistor to be connected to the second source/drain 47 of the select transistor. In this way, only one select transistor is needed for controlling a plurality of anti-fuse cells, so that an area of the programmable device 200 can be reduced in the presence of a same quantity of anti-fuses, or a quantity of anti-fuse cells can be increased while with the area remained the same, thereby improving the integration of the programmable device 200.

In some embodiments, with further reference to FIG. 2 and FIG. 3, the programmable device 200 further includes:

- a second conductive pillar 42 connected between the first source/drain 45 and the bit line 48;
- a first connection structure 43 connected between the gate 44 of the select transistor and the select signal line 40; and
- second connection structures 37, each one of the second connection structures being connected between the second end of one of the plurality of anti-fuse cells and one of the plurality of word lines.

It should be noted that the metal layer 39 is located on an upper layer of the first conductive pillars 38, and the first conductive pillars 38 and the second conductive pillar 42 are located on a same layer. Materials of the metal layer 39, the first conductive pillar 38, and the second conductive pillar 42 may be any one of or a combination of two or more of tungsten, cobalt, platinum, palladium, ruthenium, and copper.

The first connection structure 43 and the second connection structure 37 are located on a same layer and are respectively located above the first gate conductive layer 442 and the second gate conductive layer 332. The first connection structure 43 is configured to reduce a contact resistance between the gate 44 of the select transistor and the select signal line 40, and the second connection structure 37 is configured to reduce a contact resistance between the second end of the anti-fuse cell and the word line 36, thereby reducing a voltage drop on the select signal line 40 and the word line 36 and reducing power consumption.

In some embodiments, with further reference to FIG. 2, the select transistor further includes a lightly doped drain (LDD) region 46 disposed in the active region 31 below the gate 44 thereof and connected to the first source/drain 45 and the second source/drain 47. The lightly doped drain region 46 can reduce an electric field of the drain region in the select transistor, thereby improving a series of short channel effects such as the hot electron degradation effect.

In some embodiments, with further reference to FIG. 2, the select transistor further includes a first sidewall layer 41 at least disposed on sidewalls of the first gate conductive layer 442 and the first gate dielectric layer 441. The first sidewall layer 41 can prevent heavily doped ions from being implanted into the lightly doped drain region 46 to change a structure of the lightly doped drain region 46 when the first source/drain 45 and the second source/drain 47 are formed by heavy doping, and can prevent electric leakage of the first gate conductive layer 442 as well.

In some embodiments, with further reference to FIG. 2, the anti-fuse cell further includes a second sidewall layer 35 disposed at least on sidewalls of the second gate conductive layer 332 and the second gate dielectric layer 331. The second sidewall layer can at least prevent the electric leakage of the second gate conductive layer 332.

In other embodiments, the second sidewall layer 35 may not be disposed in the anti-fuse cell.

It should be noted that the gate of the select transistor and the anti-fuse cells are disposed in a dielectric layer 34 on a surface of the active region. A material of the dielectric layer 34 may be, for example, silicon dioxide.

It should be noted that it is shown in FIG. 2 that the programmable device 200 is provided with only three anti-fuse cells, and it is shown in FIG. 3 that the programmable device 200 is provided with only eight anti-fuse cells. In practical implementation, the programmable device 200 may include more anti-fuse cells.

Figure 4:
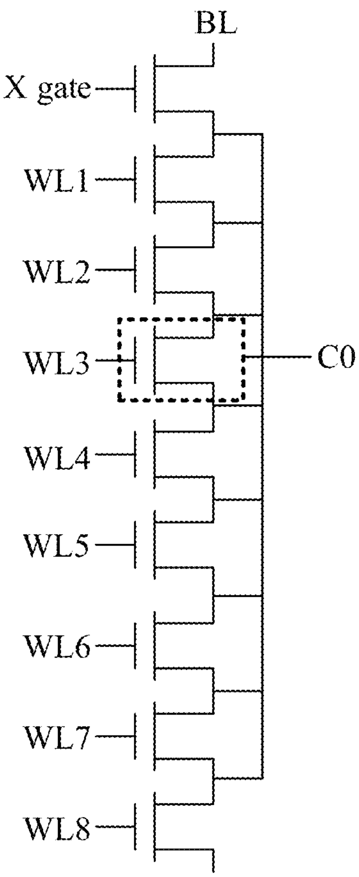
FIG. 4 is an equivalent circuit diagram of the programmable device shown in FIG. 3.

In another embodiment of the present disclosure, an operation method for the programmable device 200 is further provided and is applied to the programmable device 200 shown in FIG. 3. FIG. 4 is an equivalent circuit diagram of the programmable device 200 shown in FIG. 3, and the operation method for the programmable device 200 in the embodiments of the present disclosure is described below with reference to FIG. 3 and FIG. 4. The operation method includes:

during a programming operation, setting the bit line 48 corresponding to an anti-fuse cell required to be programmed to a first voltage, applying a second voltage to the select signal line 40, and applying a third voltage to a word line 36 corresponding to the anti-fuse cell required to be programmed, thus breaking down the anti-fuse cell required to be programmed, and meanwhile, applying the first voltage to other word lines 36 in the programmable device array to avoid breakdown of other anti-fuse cells except for the anti-fuse cell required to be programmed, where the anti-fuse cell required to be programmed is any one of the plurality of anti-fuse cells; and during a reading operation, setting the bit line 48 corresponding to an anti-fuse cell required to be read to a first voltage, applying a second voltage to the select signal line 40, and applying a fourth voltage to a word line 36 corresponding to the anti-fuse cell required to be read, thus reading data in the anti-fuse cell required to be read, and meanwhile, applying the first voltage to other word lines 36 in the programmable device, where the third voltage is greater than the second voltage, and the second voltage is greater than the first voltage, the first voltage is a zero voltage or a grounding voltage, a difference between the third voltage and the first voltage is greater than or equal to a breakdown voltage of the anti-fuse cell required to be programmed, and a difference between the second voltage and the first voltage is greater than or equal to a turn-on voltage of the select transistor.

In the embodiment of the present disclosure, when the anti-fuse cell required to be programmed is programmed, the first voltage is a zero voltage or a grounding voltage, and a difference between the second voltage and the first voltage is greater than or equal to a turn-on voltage of the select transistor, so that the select transistor can be turned on at the second voltage. For example, the second voltage may be 1.1 V to 3 V. The difference between the third voltage and the first voltage is greater than or equal to the breakdown voltage of the anti-fuse cell required to be programmed, and is less than the breakdown voltage of the select transistor, so that at the third voltage, the anti-fuse cell required to be broken down can be broken down while the select transistor is not broken down. Here, the third voltage may range from 4 V to 5.5 V, for example, 4.3 V, 4.8 V, or 5.4 V. When the anti-fuse cell required to be read is read, the fourth voltage is used to provide a current for reading, and the fourth voltage may be, for example, the power supply voltage Vdd.

A specific operation process of the programmable device is described below by taking an anti-fuse cell C0 in the programmable device in FIG. 4 as an example.

During programming, a first voltage of 0 V is applied to a bit line BL, a second voltage of 1.1 V to 3 V is applied to a gate, X gate, of the select transistor to turn on the select transistor, and a third voltage of 4 V to 5.5 V is applied to a word line WL3 corresponding to the anti-fuse cell C0. In this case, a voltage difference between two ends of the anti-fuse cell C0 is 4 V to 5.5 V, so that a second gate dielectric layer of the anti-fuse cell C0 can be broken down, and the programming process is implemented. At the same time, the first voltage is applied to other word lines except for the word line WL3 in the programmable device, so that other anti-fuse cells are not broken down.

During reading, the first voltage of 0 V is applied to the bit line BL, the second voltage of 1.1 V to 3 V is applied to the gate, X gate, of the select transistor to turn on the select transistor, and the power supply voltage Vdd, which serves as the third voltage, is applied to the word line WL3 corresponding to the anti-fuse cell C0. In this case, a relatively large current flows through the bit line BL, and the reading process is implemented. At the same time, the first voltage is applied to other word lines except for the word line WL3 in the programmable device, so that no current flows through the other anti-fuse cells.

It should be noted that, in the embodiment of the present disclosure, there is no other doped region, that is, no LDD, in the first region 321 below an anti-fuse cell adjacent to the anti-fuse cell C0. The diode below the anti-fuse cell C0 includes a reverse PN junction and is cut off, so that a high transient current generated after the anti-fuse cell C0 is broken down cannot flow to the second region 322 through the first region 321. Therefore, even if the anti-fuse cell adjacent to the anti-fuse cell C0 is also broken down, the process of reading the anti-fuse cell C0 does not affect the adjacent anti-fuse cell.

Figure 5:
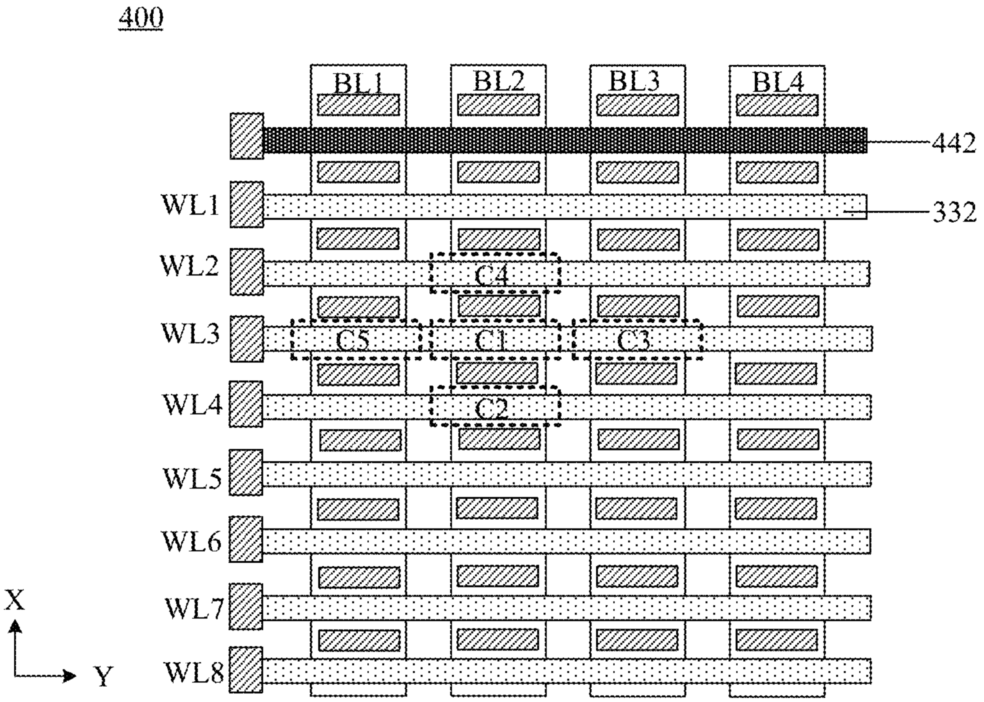
FIG. 5 is a structural schematic diagram of a programmable device array provided according to an embodiment of the present disclosure.

In another embodiment of the present disclosure, FIG. 5 is a structural schematic diagram of a programmable device array provided according to an embodiment of the present disclosure. As shown in FIG. 5, the programmable device array 400 includes:

a plurality of programmable devices 200 according to the embodiments described above arranged in sequence along a second direction (Y-axis direction), where gates 44 of select transistors arranged in a row along the second direction are connected to each other, and second ends of anti-fuse cells arranged in a row along the second direction are connected to each other.

In some embodiments, with further reference to FIG. 5, the gates 44 of the select transistors arranged in a row along the second direction are connected to a same select signal line 40, and the second ends of the anti-fuse cells arranged in a row along the second direction are connected to a same word line 36.

In the embodiment of the present disclosure, the gates 44 of the select transistors arranged in a row along the second direction are connected to each other and connected to the same select signal line 40, so that the plurality of select transistors in a same row can be turned on or off through one control end. The second ends of the anti-fuse cells arranged in a row along the second direction are connected to each other and connected to the same word line 36, so that a programming voltage or a reading voltage can be applied to the plurality of anti-fuse cells in a same row at the same time. In this way, the wiring design of the programmable device array can be simplified, and the manufacturing costs can be reduced.

In some embodiments, sizes, in the X-axis direction, of the second gate dielectric layers 331 of the plurality of anti-fuse cells arranged along the X-axis direction and the Y-axis direction may be equal. In this way, it can be avoided that a voltage difference is too large to break down one row of anti-fuse cells via a same word line 36 when different anti-fuse cells are to be broken down.

In other embodiments, the sizes, in the X-axis direction, of the second gate dielectric layers 331 of the plurality of anti-fuse cells arranged along the X-axis direction and the Y-axis direction may not be equal.

The programmable device 200 in the programmable device array 400 according to this embodiment of the present disclosure has a structure similar to that of the programmable device 200 according to the embodiments described above. For technical features that are not disclosed in detail in this embodiment of the present disclosure, reference can be made to the embodiments described above for understanding and details are not described here again.

The programmable device array provided in this embodiment of the present disclosure includes a plurality of programmable devices, and the programmable device array takes up a relatively small area because the programmable devices each take up a small area.

It should be noted that only four columns of programmable devices 200 are shown in the programmable device array 400 in FIG. 5. In practical implementation, the programmable device array 400 may include more columns of programmable devices 200.

Figure 6:
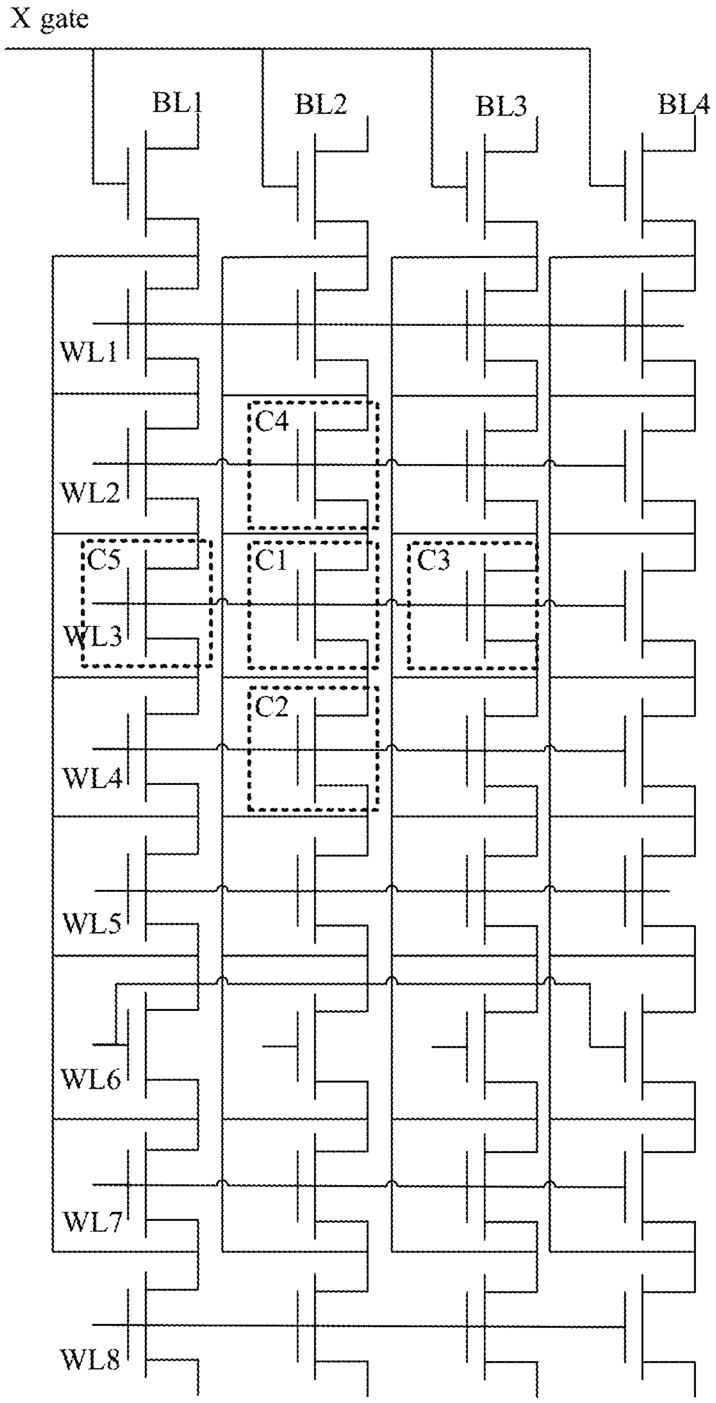
FIG. 6 is an equivalent circuit diagram of the programmable device array shown in FIG. 5.

In another embodiment of the present disclosure, an operation method for the programmable device array 400 is further provided and is applied to the programmable device array 400 shown in FIG. 5. FIG. 6 is an equivalent circuit diagram of the programmable device array 400 shown in FIG. 5, and the operation method for the programmable device array 400 in the embodiments of the present disclosure is described below with reference to FIG. 5 and FIG. 6. The operation method includes:

- during a programming operation, setting a bit line 48 corresponding to an anti-fuse cell required to be programmed to a first voltage, applying a second voltage to a select signal line 40, and applying a third voltage to a word line 36 corresponding to the anti-fuse cell required to be programmed, thus breaking down the anti-fuse cell required to be programmed, and meanwhile, applying the first voltage to other word lines 36 in the programmable device array and applying a fifth voltage to other bit lines 48 in the programmable device array to avoid breakdown of other anti-fuse cells except for the anti-fuse cell required to be programmed, where the anti-fuse cell required to be programmed is any one of a plurality of anti-fuse cells; and
- during a reading operation, setting a bit line 48 corresponding to an anti-fuse cell required to be read to a first voltage, applying a second voltage to a select signal line 40, and applying a fourth voltage to a word line 36 corresponding to the anti-fuse cell required to be read, thus reading data in the anti-fuse cell required to be read; and meanwhile, applying the first voltage to other word lines in the programmable device array, and applying the fourth voltage to other bit lines in the programmable device array, where the third voltage is greater than the second voltage, and the second voltage is greater than the first voltage; the first voltage is a zero voltage or a grounding voltage; a difference between the third voltage and the first voltage is greater than or equal to a breakdown voltage of the anti-fuse cell required to be programmed; a difference between the third voltage and the fifth voltage is less than a breakdown voltage of any one anti-fuse cell in the programmable device array; a difference between the second voltage and the first voltage is greater than or equal to a turn-on voltage of the select transistor.

In the embodiment of the present disclosure, when the anti-fuse cell required to be programmed is programmed, the first voltage is a zero voltage or a grounding voltage, and a difference between the second voltage and the first voltage is greater than or equal to a turn-on voltage of the select transistor, so that the select transistor can be turned on at the second voltage. For example, the second voltage may be 1.1 V to 3 V. The difference between the third voltage and the first voltage is greater than or equal to the breakdown voltage of the anti-fuse cell required to be programmed and is less than the breakdown voltage of the select transistor, so that at the third voltage, the anti-fuse cell required to be broken down can be broken down while the select transistor is not broken down. Here, the third voltage may range from 4 V to 5.5 V, for example, 4.3 V, 4.8 V, or 5.4 V. In this case, to avoid false breakdown of the other anti-fuse cells adjacent to the anti-fuse cell required to be programmed, the bit lines 48 of the other anti-fuse cells adjacent to the anti-fuse cell required to be programmed need to be set to the fifth voltage, the other word lines 36 adjacent to the anti-fuse cell required to be programmed need to be set to the first voltage, and a difference between the fifth voltage and the first voltage is allowed to be less than the breakdown voltage of any one anti-fuse cell in the programmable device array 400. Here, the fifth voltage may be, for example, 2.5 V.

When the anti-fuse cell required to be read is read, the fourth voltage is used to provide a current for reading, and the fourth voltage may be, for example, the power supply voltage Vdd.

A specific operation process of the programmable device array 400 is described below by taking an anti-fuse cell C1 in the programmable device array in FIG. 6 as an example.

During programming, a first voltage of 0 V is applied to a bit line BL2 corresponding to the anti-fuse cell C1, a second voltage of 1.1 V to 3 V is applied to gates, X gates, of the select transistors to turn on all select transistors, and a third voltage of 4 V to 5.5 V is applied to a word line WL3 corresponding to the anti-fuse cell C1. In this case, a voltage difference between two ends of the anti-fuse cell C1 is 4 V to 5.5 V, so that a second gate dielectric layer of the anti-fuse cell C1 can be broken down, and the programming process is implemented. At the same time, the first voltage is applied to other word lines (for example, a word line WL1, a word line WL2, a word line WL4, a word line WL5, a word line WL6, a word line WL7, and a word line WL8) except for the word line WL3 in the programmable device array, and the fifth voltage of 2.5 V is applied to other BLs (for example, a bit line BL1, a bit line BL3, a bit line BL4, etc.) except for the bit line BL2, so that other anti-fuse cells are not broken down.

In the embodiment of the present disclosure, when the anti-fuse cell C1 is programmed, although there are low voltages at the bit line BL2 end in an anti-fuse cell C2 and an anti-fuse cell C4, there is no voltage difference as voltages at the word line WL2 end and the word line WL4 end are low, and therefore the anti-fuse cell C2 and the anti-fuse cell C4 are not falsely broken down. In addition, the first region 321 below the anti-fuse cell C1 is not provided with an LDD and a PN junction is formed here, and a transient current generated after the anti-fuse cell C1 is broken down does not affect the anti-fuse cell C2 and the anti-fuse cell C4. Therefore, when the anti-fuse cell C1 is being broken down, its surrounding anti-fuse cells (fuses) will not be falsely broken down.

During reading, the first voltage of 0 V is applied to the bit line BL2 corresponding to the anti-fuse cell C1, the second voltage of 1.1 V to 3 V is applied to the gate, X gate, of the select transistor to turn on the select transistor, and the power supply voltage Vdd, which serves as the third voltage, is applied to the word line WL3 corresponding to the anti-fuse cell C1. In this case, a relatively large current flows through the bit line BL, and the reading process is implemented. At the same time, the first voltage is applied to other word lines (for example, the word line WL1, the word line WL2, and the word line WL4) except for the word line WL3 in the programmable device array, and the fourth voltage is applied to other bit lines (for example, the bit line BL1, the bit line BL3, and the bit line BL4) except for the bit line BL2 in the programmable device array, so that no current flows through the other anti-fuse cells.

In the embodiment of the present disclosure, when the anti-fuse cell C1 is being read, there is Vdd at the word line WL3 in an anti-fuse cell C5 and an anti-fuse cell C3, but there is also Vdd at the bit line BL1 and the bit line BL3, so that there is no current here. Therefore, when the anti-fuse cell C1 is read after being programmed, its surrounding anti-fuse cells (fuses) are not affected or subjected to electric leakage.

Another embodiment of the present disclosure further provides a memory including the programmable device array 400 (referring to FIG. 5) according to any one of the embodiments described above. The programmable device array 400 includes the programmable device 200 (referring to FIG. 3) according to any one of the embodiments described above.

The programmable device 200 includes: a bit line 48; a select transistor, a first source/drain 45 of the select transistor being electrically connected to the bit line 48; a select signal line 40, the select signal line 40 being electrically connected to a gate 44 of the select transistor; a plurality of diodes 32; a plurality of anti-fuse cells, a first end of the anti-fuse cell being electrically connected to a second source/drain 47 of the select transistor via a corresponding diode 32; and a plurality of word lines 36, the word line 36 being electrically connected to a second end of a corresponding anti-fuse cell.

In some embodiments, the memory described above may include, but is not limited to, a random access memory (RAM), for example, a dynamic random access memory (DRAM).

In the embodiment of the present disclosure, the memory includes the programmable device array 400 described above, and as the programmable device array 400 takes up a relatively small area, the integration of the memory can be improved, and a storage capacity of the memory is effectively enhanced, improving the performance of the memory.

In the embodiments provided in the present disclosure, it should be understood that the disclosed structures and methods may be implemented in a non-targeted manner. The structural embodiments described above are merely illustrative. For example, the division into the units is only a logical functional division, and in actual implementation, there may be other division manners. For example, a plurality of units or modules may be combined, or may be integrated into another system; or some features may be ignored or not implemented. In addition, the various components shown or discussed are coupled or directly coupled to each other.

The features disclosed in the method or structural embodiments provided in the present disclosure may be combined in any manner if without conflict to obtain new method or structural embodiments.

The foregoing descriptions are only some embodiments of the present disclosure, but the scope of the present disclosure is not limited thereto. Changes or substitutions that any one skilled in the art can easily think of within the technical scope disclosed by the present disclosure shall all fall within the protection scope of the present disclosure. Therefore, the protection scope of the present disclosure shall be defined by the protection scope of the claims.

What is claimed is:

1. A programmable device, comprising:

a bit line;

a select transistor, a first source/drain of the select transistor being electrically connected to the bit line;

a select signal line, the select signal line being electrically connected to a gate of the select transistor;

a plurality of diodes each having a first region and a second region;

a plurality of anti-fuse cells, a first end of each one of the plurality of anti-fuse cells being electrically connected to a second source/drain of the select transistor via a corresponding one of the plurality of diodes;

a plurality of word lines, each one of the plurality of word lines being electrically connected to a second end of a corresponding one of the plurality of anti-fuse cells;

wherein the plurality of diodes are disposed in a substrate; the first region is adjacent to one of the plurality of anti-fuse cells; the second region of one of the plurality of diodes corresponding to one of the plurality of anti-fuse cells adjacent to the select transistor occupies a same position as the second source/drain; and a metal layer connecting the second source/drain with the second region of the one of the plurality of diodes corresponding to the anti-fuse cell distal from the select transistor being connected to the second source/drain.

2. The programmable device according to claim 1, further comprising a plurality of first conductive pillars, each connected to the second region of the one of the plurality of diodes corresponding to the anti-fuse cell distal from the select transistor, and collectively connected to the metal layer.

3. The programmable device according to claim 2, wherein the select transistor and the plurality of anti-fuse cells are disposed in a same active region and spaced apart in sequence along a first direction; and the programmable device further comprises:

a second conductive pillar connected between the first source/drain and the bit line;

a first connection structure connected between the gate of the select transistor and the select signal line; and second connection structures, each one of the second connection structures being connected between the second end of one of the plurality of anti-fuse cells and one of the plurality of word lines.

4. The programmable device according to claim 3, wherein the select transistor comprises a first gate dielectric layer and a first gate conductive layer on a surface of the first gate dielectric layer;

the anti-fuse cell comprises a second gate dielectric layer and a second gate conductive layer on a surface of the second gate dielectric layer, wherein a thickness of the second gate dielectric layer is less than a thickness of the first gate dielectric layer.

5. The programmable device according to claim 3, wherein the first region and the same active region are N-type doped, and the second region and the first source/drain are P-type doped.

6. The programmable device according to claim 1, wherein the first region is electrically connected to the first end, the second region is electrically connected to the second source/drain.

7. The programmable device according to claim 6, wherein the second region and the second source/drain overlay in the substrate.

8. The programmable device according to claim 6, wherein the second region and the second source/drain are P-type doped, and the first region is N-type doped.

9. The programmable device according to claim 6, wherein the first region is N-type doped, and the second region and the first source/drain are P-type doped.

10. The programmable device according to claim 9, further comprising a first conductive pillar, wherein the second region is connected to the metal layer via the first conductive pillar.

11. A programmable device array, comprising:

a plurality of programmable devices each comprising:

a bit line;

a select transistor having a first source/drain electrically connected to the bit line;

a select signal line electrically connected to a gate of the select transistor;

a plurality of diodes;

a plurality of anti-fuse cells each having a first end electrically connected to a second source/drain of the select transistor via a corresponding one of the plurality of diodes; and a plurality of word lines each electrically connected to a second end of a corresponding one of the plurality of anti-fuse cells;

wherein the plurality of programmable devices are arranged in sequence along a second direction, wherein gates of a plurality of select transistors arranged in a row along the second direction are connected to each other, and second ends of the plurality of anti-fuse cells arranged in a row along the second direction are connected to each other.

12. The programmable device array according to claim 11, wherein the gates of the plurality of select transistors arranged in a row along the second direction are connected to a same select signal line; and the second ends of the plurality of anti-fuse cells arranged in a row along the second direction are connected to a same word line.

13. An operation method, applied to the programmable device array according to claim 11, the method comprising:

during a programming operation, setting a bit line corresponding to an anti-fuse cell required to be programmed to a first voltage, applying a second voltage to a select signal line, and applying a third voltage to a word line corresponding to the anti-fuse cell required to be programmed, thereby breaking down the anti-fuse cell required to be programmed, and meanwhile, applying the first voltage to other word lines in the programmable device array and applying a fifth voltage to other bit lines in the programmable device array to avoid breakdown of other anti-fuse cells except for the anti-fuse cell required to be programmed, wherein the anti-fuse cell required to be programmed is any one of a plurality of anti-fuse cells;

wherein the third voltage is greater than the second voltage, and the second voltage is greater than the first voltage; the first voltage is a zero voltage or a grounding voltage; a difference between the third voltage and the first voltage is greater than or equal to a breakdown voltage of the anti-fuse cell required to be programmed; a difference between the third voltage and the fifth voltage is less than a breakdown voltage of any one anti-fuse cell in the programmable device array; a difference between the second voltage and the first voltage is greater than or equal to a turn-on voltage of the select transistor.

* * * * *